United States Patent [19]

De Bijl et al.

[11] Patent Number: 5,586,192

[45] Date of Patent: Dec. 17, 1996

[54] METHOD OF AND DEVICE FOR DETECTING PULSATORY INTERFERENCE SIGNALS IN A SOUND SIGNAL

[75] Inventors: Mario J. De Bijl; Franciscus J. A. M. Sessink, both of Eindhoven, Netherlands

[73] Assignee: U.S. Philips Corporation, New York, N.Y.

[21] Appl. No.: 599,283

[22] Filed: Feb. 9, 1996

Related U.S. Application Data

[63] Continuation of Ser. No. 200,136, Feb. 22, 1994, abandoned.

[30] Foreign Application Priority Data

Mar. 19, 1993 [EP] European Pat. Off. .............. 93200805

[51] Int. Cl.$^6$ ................................................. H04B 15/00
[52] U.S. Cl. ................................. 381/94; 381/93; 375/348
[58] Field of Search ........................ 381/94, 93; 455/296, 455/312; 375/346, 343, 348, 350, 317

[56] References Cited

U.S. PATENT DOCUMENTS 3,700,812  10/1972  Springett .............................. 455/312
5,067,157  11/1991  Ishida ...................................... 381/94

FOREIGN PATENT DOCUMENTS 2912689  1/1980  Germany .

Primary Examiner—Curtis Kuntz
Assistant Examiner—Minsun Oh
Attorney, Agent, or Firm—Leroy Eason

[57] ABSTRACT

For detecting pulsatory interference in a sampled audio signal, the value of a given signal sample is compared with the values of previous as well as subsequent signal samples within a selected time window. If the given sample, multiplied by a selected attenuation factor, exceeds a certain percentage of all such samples, that identifies it as an interference pulse. It can then be replaced by an interpolated sample value derived from adjoining samples over a selected interval of the signal.

7 Claims, 2 Drawing Sheets

METHOD OF AND DEVICE FOR DETECTING PULSATORY INTERFERENCE SIGNALS IN A SOUND SIGNAL

This is a continuation of application Ser. No. 08/200,136, filed Feb. 22, 1994, now abandoned.

BACKGROUND OF THE INVENTION

The invention relates to a method of detecting pulsatory interference signals in an audio signal.

A method of this type is known, inter alia, from German Patent Specification 2.912.689 and is used, for example, in FM car radio receivers having a circuit for suppressing the pulsatory interference signals (IAC=Interference Absorption Circuit). In these receivers the received and demodulated multiplex signal is passed through a restoration circuit which is blocked during the occurrence of an interference pulse, which pulse is replaced, for example, by the signal level stored in a memory just before the occurrence of the interference pulse.

For detecting the interference pulses in the received multiplex signal the fact is utilized that the interference pulses comprise frequency components above the frequency band of the useful multiplex signal. For example, in FM stereo receivers the demodulated multiplex signal covers the frequency range up to approximately 60 kHz. By passing this signal through a high-pass filter having a cut-off frequency of approximately 60 kHz, the components of the useful multiplex signal are suppressed to a considerable extent. A signal mixture then remains which, in addition to noise, comprises pulsatory interference signals extending beyond the noise level, which interference signals can subsequently be detected by means of a threshold circuit.

However, the known method has a number of drawbacks which have gained greater significance in the course of time. The major drawbacks are:

1. Due to the increase of the number and strength of neighbouring transmitters, the frequency range above 60 kHz of a multiplex signal is increasingly disturbed so that the selection of the pulsatory interferences from the signals present in this frequency range is considerably worse.
2. The increased IF amplification between the last intermediate-frequency filter and the FM detector produces a noise spectrum in said frequency range which is more unfavourable for a satisfactory detection of interference at a low field strength.
3. The trend towards greater channel selectivity attenuates noise and neighbouring channel interference in said frequency range, but it attenuates to an even greater extent the components of the pulsatory interference signals in this range. Detection of these interference signals in accordance with the known method will therefore become substantially impossible.

SUMMARY OF THE INVENTION

It is an object of the invention to provide a method in which the drawbacks described above occur to a much lesser extent, and to this end the method according to the invention is characterized by reception of samples of the audio signal, storage of samples located in a time window around a given sample, comparison of the level of the given sample with that of previous and subsequent samples of the time window, and identification of the given sample as a pulsatory interference based on comparison of the level of the given sample with the levels of said previous and subsequent signal samples.

In the known method the pulsatory interference signals are distinguished from the wanted sound signals on the basis of the presence of components of higher frequency, i.e. on the basis of the slopes of the interference signals with respect to those of the useful sound signals. The method according to the invention pursues a completely different course for distinguishing the interference signals, using the criterion that these signals extend to a certain extent in amplitude beyond the signal levels occurring before an interference pulse as well as the signal levels occurring after such a pulse. The interference pulses are therefore detected from the useful signal on the basis of their amplitude and duration. If the useful signal levels around the interference pulse are substantially as large as the interference pulse, the interference pulse will not be identified as such. However, this is not a drawback and is even desirable because in these cases the useful signal will auditively mask the interference for the greater part and restoration of the useful signal is not necessary.

The method according to the invention is based on the presence of sampled signals and is thus particularly suitable for use in the field of digital sound signal processing. It is true that the method requires a comparatively long storage of the sampled signals, but this need not be a drawback in the present advanced state of integrated circuit techniques.

The invention may be realised, for example, by determining the average value of the rectified levels of said previous and subsequent signal samples and by subsequently computing the ratio of the level of the given signal sample and this average value. If this ratio is larger than a predetermined value, for example 2, the given sample will be identified as an interference pulse, or as a pulse associated with an interference pulse.

A preferred embodiment of the method according to the invention is more reliable in the sense that a larger number of the interference pulses present are identified as such and fewer parts of the signal itself are identified as interference pulses. Such embodiment is characterized by identification of the given sample as a pulsatory interference if the level of said sample, multiplied by a predetermined factor ($\alpha$) which is smaller than 1, exceeds that of at least 60% of the previous and subsequent samples. This preferred method implies, inter alia, that the given sample is identified as an interference pulse if this sample, multiplied by the predetermined factor, is larger than all previous and all subsequent samples within a time window. However, this method is still further preferably characterized by identification of the given sample as a pulsatory interference if the level of said sample, multiplied by the predetermined factor, exceeds that of approximately 90% of the previous and subsequent samples. This has the advantage that also interference pulses are detected which are several, for example two or three samples wide and that also an interference pulse is detected when it is the only interference pulse in the time window.

In a method according to the invention performed successfully in practice the time window comprised 31 signal samples and the level of the central signal sample was compared with the levels of the 15 previous and the 15 subsequent signal samples. If 3 or less of the 30 signal samples were larger than the central signal sample, multiplied by said factor, this central signal sample was identified as an interference pulse. In that case there were thus 27 or more, i.e. 90% or more of the 30 signal samples, which were smaller than the central signal sample attenuated by the factor α. Said factor α was chosen to be 0.5. If this factor is chosen too close to 1, peaks of the useful sound signal are also identified as interference pulses and if factor α is too small, many interference pulses are not identified as such. The optimum value of α is dependent on the transmission path of the signals. In interference pulse detection in FM car radio receivers usable values of the factor α will generally be between 0.15 and 0.75.

The method according to the invention may be used for detecting interference pulses in a stereo multiplex FM signal. However, the method according to the invention is then preferably characterized in that the signal is an audio signal obtained after the stereo multiplex signal has been decoded. The advantage thereof is that the detection is not impeded by the presence of the stereo pilot (at 19 kHz) or of signals above 53 kHz (neighbouring transmitters, RDS signals, etc.).

A further preferred method for use with a stereo signal comprising a left and a right audio signal is characterized in that the signal used is derived from the difference between the left and the right audio signal. In fact it has been found that the distinction between interference pulses and useful signals is generally larger in the difference signal than in the right and the left audio signals themselves or in their sum signal.

The invention also relates to a device for detecting pulsatory interference signals in an audio signal such end this device is characterized by means for receiving samples of the audio signal, a storage medium for storing samples located in a time window around a given sample, means for comparing the given sample with previous and subsequent samples, and means for identifying said given sample as a pulsatory interference based on comparison of the level of the given sample with the levels of said previous and subsequent signal samples.

These and other aspects of the invention will be apparent from and elucidated with reference to the embodiments described hereinafter.

DESCRIPTION OF THE PREFERRED EMBODIMENTS

Figure 1:
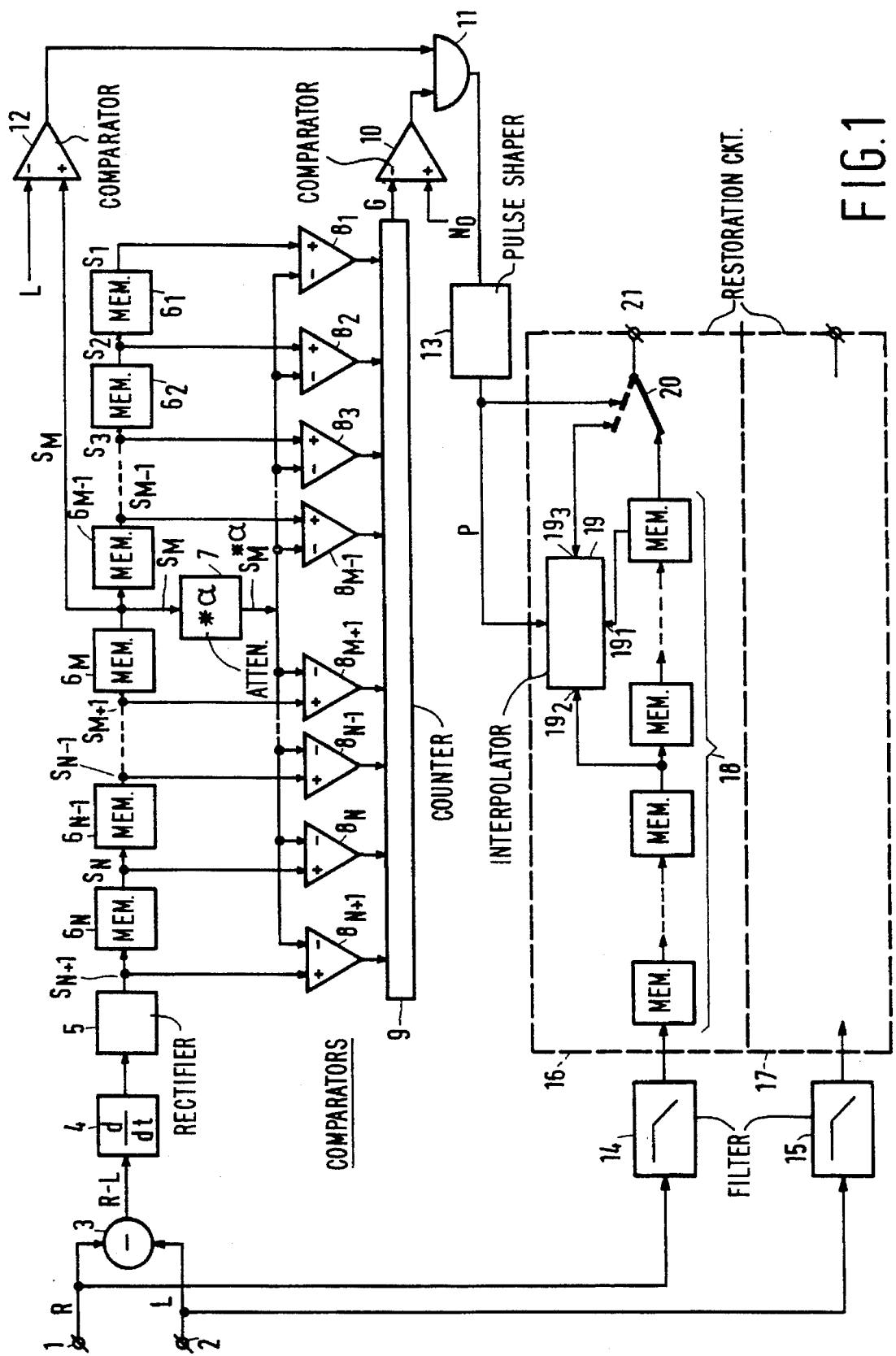
FIG. 1 is a block diagram of a device according to the invention.

The device of FIG. 1 has two input terminals 1 and 2 for the right (R) and left (L) components, respectively, of a stereo audio signal. These signals originate from a stereo decoder (not shown) and are digitized at a sampling frequency of, for example 38 kHz. The stereo decoder may be an analog decoder in which the output signals are digitized by means of A/D converters, or a digital stereo decoder may be used as described, for example in the published EP Application no. 91201051.9 (PHN 13.683). When, as will be further described, the interference pulse detection is performed on the R-L signal, it is necessary that the stereo decoder decodes the R-L band of the multiplex signal at all times, thus also in the case of monoreception.

The two audio signals may comprise pulsatory interference signals. For an optimum interference detection and restoration it is ensured that the audio signals comprise few remainders of the conventional 19 kHz FM stereo pilot. Moreover, the normal 50 μs pre-emphasis to which the R and L audio signals are subjected in the transmitter is not compensated at the input terminals 1 and 2 because the de-emphasis which is necessary for this purpose would lead to an attenuation of the interference pulses to be detected.

The two signals R and L are subtracted from each other in a subtracter circuit 3 and the resultant R-L difference signal is subsequently differentiated in a differentiator 4. The differentiator attenuates the audio signal with respect to the interference pulses. It has been found that the R and L audio signals, particularly their components of a lower frequency, are in conformity with each other to a certain extent so that they compensate each other to a considerable extent in the R-L signal. This is true to a lesser extent for interference pulses, which comprise principal components in the higher part of the audio spectrum (0-15 kHz). The differentiator 4 forms a second means of giving the higher audio frequencies and hence the interference pulses an advantage over the audio signals so that the interference pulses will be further beyond the audio signals. A customary differentiator for digital signals has a delay of one sampling period and a subtracter circuit for subtracting the delayed and the undelayed signal from each other. It is of course also possible to first differentiate the R and L input signals and subsequently subtract the differentiated R and L signals from each other. It is further possible to replace the differentiator 4 by another filter which gives the higher frequencies of the audio frequency range of 0-15 kHz an advantage over the lower frequencies of this range.

The differentiated R-L difference signal from the differentiator 4 is subsequently applied to a rectifier 5 in the form of an absolute-value forming circuit which converts the negative signal samples into positive samples so that the negative and positive interference pulses are detected in an equal manner.

The signal samples are subsequently applied to a cascade circuit of N memory cells $6_1$ to $6_N$, in which the input of the cell $6_N$ is coupled to the output of the rectifier 5 and the input of each further cell is coupled to the output of the previous cell. The connection between two of the memory cells, $6_{M-1}$ and $6_M$, is coupled to the input of an attenuator 7. During operation the signal samples from the rectifier 5 are successively shifted into the memory cells $6_N$ to $6_1$, which cells jointly constitute a shift register. At each instant the last-received N+1 signal samples $S_1 \ldots S_{N+1}$ form a time window, with the signal sample $S_1$ being present at the output of the cell $6_1$, the signal sample $S_M$ being present at the output of the cell $6_M$, the signal sample $S_N$ being present at the output of the cell $6_N$ and the signal sample $S_{N+1}$ being present at the output of the rectifier 5. The signal sample $S_M$ is preferably the central sample of the signal samples $S_1$ to $S_{N+1}$ (for example, N=30 and M=16) but it is not necessary for the signal sample $S_M$ to be exactly in the centre of the time window.

The signal sample $S_M$ is attenuated in the attenuator 7 by a factor α (for example α=0.5) and the attenuated signal $S_M*\alpha$ is applied to the −inputs of a plurality of comparators $8_1$ to $8_{M-1}$ and $8_{M+1}$ to $8_{N+1}$. The +inputs of each comparator $8_1$ to $8_{M-1}$ are coupled to the outputs of each memory cell $6_1$ to $6_{M-1}$, respectively, the +inputs of each comparator $8_{M+1}$ to $8_N$ are coupled to the outputs of each memory cell $6_{M+1}$ to $6_N$, respectively, and the +input of the comparator $8_{N+1}$ is coupled to the output of the rectifier 5. Consequently, the comparators $8_1$ to $8_{M-1}$ and $8_{M+1}$ to $8_{N+1}$ are used to compare the signal samples $S_1$ to $S_{M-1}$ and $S_{M+1}$ to $S_{N+1}$ of the time window $S_1$ to $S_{N-1}$ with the attenuated value $S_M*\alpha$ of the central signal sample $S_M$, and each comparator supplies at its output, for example, a logic 1 when the relevant signal sample $S_1$ to $S_{M-1}$, $S_{M+1}$ to $S_{N+1}$ is larger than $S_M*\alpha$ and a logic 0 when the relevant signal sample is smaller than $S_M*\alpha$.

All outputs of the comparators 8 are connected to a counter 9 counting how many N comparator outputs yield a logic 1 and this number G is compared in a comparator 10 with a predetermined number $N_0$. The output of the comparator 10 supplies a pulse when the number G at the output of the counter 9 is lower than the predetermined number $N_0 (G<N_0)$.

In an embodiment tested in practice the length of the time window was chosen to be 31 signal samples (hence N=30). Moreover, M was chosen to be 16, the attenuation factor $\alpha$ was chosen to be 0.5 and the number $N_0$ was chosen to be 4. If the signal sample $S_M$ is more than $1/\alpha$, hence more than twice as large as all N other signal samples of the time window, all comparators 8 will supply a logic 0 to the counter 9, and the initial number of the counter will then be equal to zero and the comparator 10 will supply a pulse. This means that the signal sample $S_M$ is identified as an interference pulse. Even if the signal sample $S_M$ is more than twice as large as the previous signal samples it will be identified as an interference pulse. However, if $S_M$ is not more than twice as large as four or more of the previous signal samples, the initial number G of the counter 9 will be 4 or more, and so the comparator 10 will not supply a pulse and the signal sample $S_M$ will not be identified as an interference pulse.

The output of the comparator 10 is coupled to an input of an AND gate 11. The other input of this AND gate is connected to the output of a comparator 12 in which the signal sample $S_M$ is compared with a level L which is approximately 50 dB below the maximum level of the audio signals supplied by the rectifier 5. When the signal sample $S_M$ has such a low value that it is below the level L, the output of the comparator 12 supplies a logic 0 so that the AND gate 11 is inhibited. A possible pulse at the output of the comparator 10 is then obstructed by the AND gate 11. This measure prevents unwanted activation of the signal restoration to be described hereinafter, if the signal levels have such a low value that the interference pulses can no longer be detected in a sufficiently reliable manner.

The procedure described above determines whether the signal sample $S_M$ midway between the other signal samples of the time window represents an interference pulse or forms part of an interference pulse. When a subsequent signal sample is received, all signal samples are shifted one position in the cascade circuit of memory cells. The original signal sample $S_{M+1}$ has now become the signal sample $S_M$ and it is determined accordingly whether this signal sample is an interference pulse.

For restoring the received R and L audio signals the pulses at the output of the AND gate 11 are applied to a pulse shaper 13 which generates a restoration pulse P having a period of ten signal sampling periods upon reception of a pulse from the AND gate 11. As will be further described, the interference pulse present in the R and L audio signals is blocked by means of this restoration pulse P and replaced by signal samples which are obtained by means of linear interpolation of undisturbed signal samples before and after the interference pulse. A period of ten signal sampling periods has been chosen for the restoration pulse P because an interference pulse in the R and L audio signals will have become substantially extinct after this period.

The R and L audio signals from the input terminals are each applied via high frequency de-emphasis filters 14 and 15 to restoration circuits 16 and 17, respectively. The position of the de-emphasis filters upstream of the restoration circuits does have the drawback that the duration of the interference pulses in the audio signals will be longer. However, positioning of these filters downstream of the restoration circuits would have the greater drawback that since higher audio frequencies occur in audio signals to a considerable extent large residual errors would thereby be produced during the restoration.

The restoration circuit 16 comprises a cascade of memory cells 18, a linear interpolator 19 having a first input $19_1$ which is connected to the output of the last cell of the memory cells 18, and a second input $19_2$ which is connected to the output of the last cell but ten of the memory cells 18. The restoration circuit 16 further has a switch 20 which connects a right audio signal output 21 to either the output of the last cell of the memory cells 18 or to the output $19_3$ of the linear interpolator. Both the switch 20 and the linear interpolator 19 are controlled by the restoration pulse P from the pulse shaper 13.

Normally, the switch 20 is in the position shown in which the audio signal output 21 is connected to the last cell of the memory cells 18 and the de-emphasized audio signal is applied to the output 21 via the memory cells 18. The cascade 18 comprises such a number of memory cells that upon detection of an interference pulse the last memory cell comprises the last undisturbed signal sample before the interference pulse. If an interference pulse is detected, the undisturbed signal sample present in the last cell of the memory cells 18 before the interference and the signal sample present in the last cell but ten after the interference are stored in the restoration circuit 19 under the control of the restoration pulse P. During the restoration pulse P intermediate signal samples are linearly interpolated by means of these two stored signal samples and supplied at the output $19_3$. These signal samples obtained by means of linear interpolation are applied to the signal output 21 by means of the switch 20 which has changed position during the restoration pulse P. The restoration circuit 17 required for storing the left audio signal has a structure which is identical to that of the circuit 16.

It is to be noted that the subtracter circuit 3, the differentiator 4 and/or the rectifier 5 are not essential elements of the invention. They are incorporated in the device of FIG. 1 for reducing the risk that interference pulses which are present remain undetected. If the invention is used for detecting interference pulses caused, for example by scratches in a gramophone record, these measures will generally not be necessary. It is further to be noted that the device of FIG. 1 need not operate digitally. Said device may operate in a corresponding manner by means of time-discrete analog signals, for example by means of switched capacitance techniques.

Instead of using a hardware device as is shown in FIG. 1, the invention may alternatively be realised by means of a programmed digital signal processor. For example, a Motorola 56001 digital signal processor which is programmed in accordance with the flow chart of FIG. 2 may be used for this purpose. Constants and variables having a corresponding function as in the device of FIG. 1 are denoted by the same references. The various program blocks in the flow chart of FIG. 2 have the following functions:

Block I comprises the program steps with which various constants and variables are initialized such as N:=30, $\alpha$:=0.5, $N_0$:=4, T(=duration of the restoration period+1):= 11, H (=counter):=T, L:=0.01.

Block II waits for an interrupt by an incoming signal sample. As soon as a signal sample is received, the processing operation is passed on to block III.

Block III. The incoming sample of the signal to be restored is stored in a memory segment B and the incoming sample of the R-L signal on which the interference detection is to be performed is rectified by means of the ABS function and subsequently stored in a memory segment A. Such a memory segment preferably comprises a predetermined fixed portion of the memory and a pointer pointing out which one of the memory sites forms the start (or the end) of the memory segment, as well as a pointer pointing out which memory site comprises the signal sample $S_M$. Storage of a new incoming signal sample then means that the oldest signal sample is replaced by the new one and that the contents of the two pointers are changed. Moreover, a counter G is set to zero in block III.

Block IV determines whether H<T. If this is the case, a started restoration process has not been ended yet and this process is continued in block X.

Block V passes on the oldest signal sample present in memory segment B to the signal output.

Block VI determines whether the signal sample $S_M$ is smaller than L. If this is the case, the processing operation returns to the interrupt loop II.

Block VII is performed N+1 times and comprises the blocks VIIa, VIIb and VIIc, block VIIa each time retrieving a subsequent signal sample from the memory segment A, block VIIb checking whether this retrieved signal sample is larger than $S_M*\alpha$ and, if this is the case, block VIIc raising the counter G by one unit (G:=G+1).

Block VIII checks whether the counter G is larger than $N_0$. If this is the case, the signal sample $S_M$ is not identified as an interference pulse and the processing operation returns to the interrupt loop II. However, if G is not larger than $N_0$, the signal sample $S_M$ is identified as an interference pulse and the processing operation continues with block IX.

Block IX sets the counter H to 1 indicating for block IV that a restoration process has been started. Moreover, two signal samples are retrieved from the memory segment B: the oldest signal sample and the signal sample which is T−1 sampling periods younger. The difference between the two signal samples is divided by T and the result is placed in a variable DC. The above-mentioned oldest signal sample is placed in a variable C. Subsequently, the processing operation returns to the interrupt loop II.

Block X performs the restoration by means of linear interpolation. The variable C is raised by DC (C:=C+DC) and applied to the signal output. The counter H is raised by the unit so that block IV can determine when the restoration process has been ended (when H=T). Subsequently the processing operation returns to the interrupt loop II.

Figure 2:
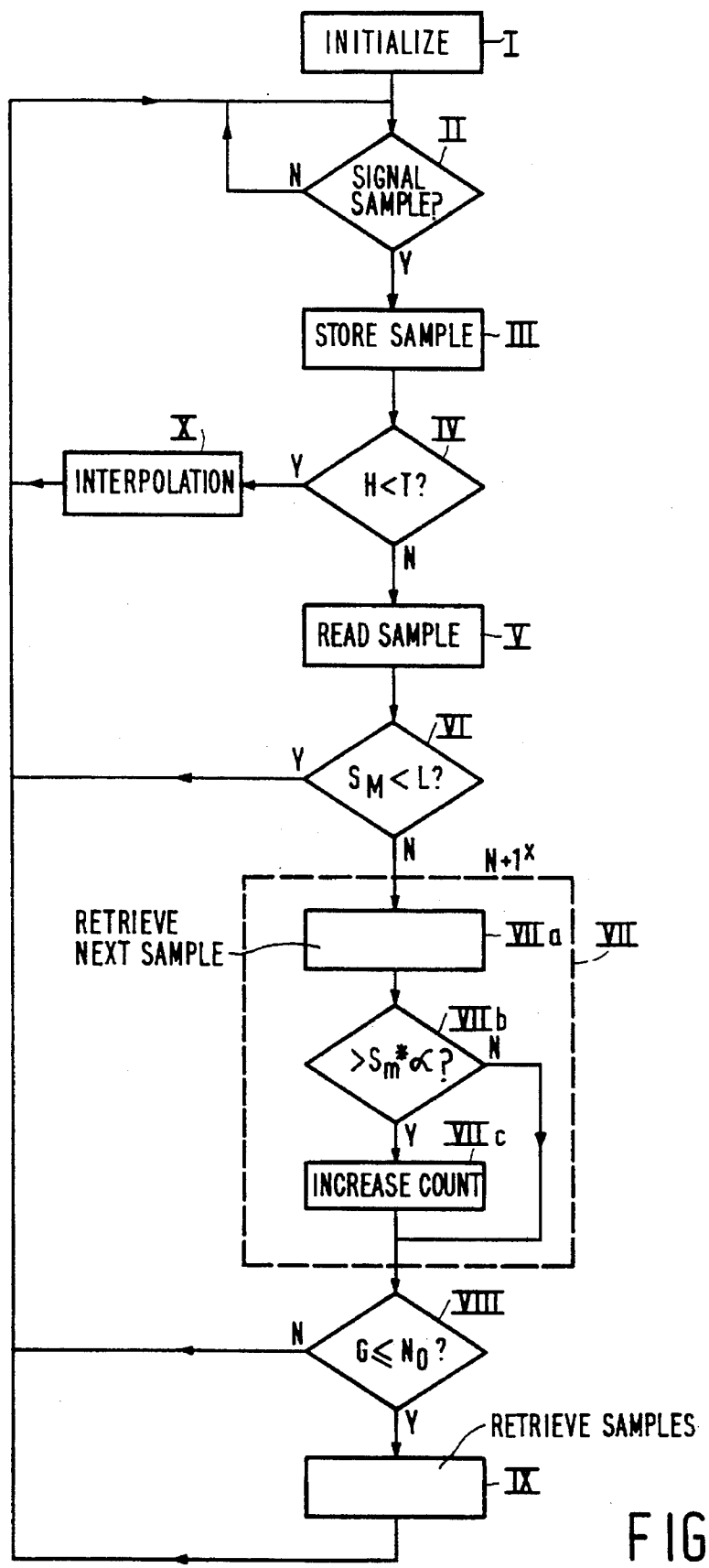
FIG. 2 shows a flow chart of a method according to the invention.

It is to be noted that in the embodiment of FIG. 2 the comparison of the signal sample $S_M$ with the other signal samples of the time window is effected sequentially, whereas this is effected simultaneously in the embodiment of FIG. 1. For the sake of simplicity of the program, the attenuated signal sample $S_M*\alpha$ is not only compared with the N signal samples prior and subsequent to $S_M$ but also with $S_M$ itself in FIG. 2. This comparison of course always raises G by one unit, because $S_M>S_M*\alpha$. However, this is compensated because an interference pulse is identified if $G<=N_0$ in FIG. 2, whereas an interference pulse is identified if $G<N_0$ in FIG. 1.

It is further to be noted that other modifications are possible within the scope of the invention. For example, a time window of 40 signal samples may be loaded into a memory while, preferably during loading, the maximum level of the 40 signal samples is determined and stored. Subsequently the 40 signal samples are scanned and those signal samples having a level which is larger than, for example 0.5 times the stored maximum level are marked. If the number of signal samples thus marked is smaller than, for example 4, these marked signal samples are identified as interference pulses and consecutively used for initiating the signal restoration. The process described above is a double process having a given overlap between the two memories so that, for example the signal samples 31 to 40 of the first memory also constitute the signal samples 1 to 10 of the second memory.

We claim:

1. A method of identifying interference pulses in an audio signal, said method comprising:
    (a) receiving samples of the audio signal derived at successive sampling instants;
    (b) storing any given sample and a predetermined number of other samples in a time window around the given sample;
    (c) comparing the values of each of the other samples in the time window with a reference level which corresponds to the value of the given sample;
    (d) deriving a count (G) of the number of said other samples which exceeds said reference level; and
    (e) identifying the given sample as an interference pulse when said count (G) signifies a number of samples below a selected percentage of all samples in said time window.

2. A method as claimed in claim 1, wherein said reference level is the value of the given sample multiplied by an attenuation factor ($\alpha$) which is less than 1, and said selected percentage is at least 60%.

3. A method as claimed in claim 1, wherein the audio signal is derived from a decoded stereo multiplex signal.

4. A method as claimed in claim 1, wherein the audio signal represents the difference between left and right components of a decoded stereo multiplex signal.

5. A device for identifying interference pulses in an audio signal, said device comprising:
    means for receiving samples of the audio signal derived at successive sampling instants;
    memory means for storing any given sample and at least two other samples which are in a time window around the given sample;
    comparator means coupled to said memory means for comparing the values of each of said other samples with a reference level which corresponds to the value of the given sample;
    accumulator means coupled to said comparator means for deriving a count (G) of the number of said other samples which exceed said reference level; and
    further comparator means coupled to said accumulator means for providing an interference pulse identification when said count (G) signifies a number of samples below a selected percentage of all samples in said time window.

6. A device as claimed in claim 5, wherein said reference level is the value of said given sample multiplied by an attenuation factor ($\alpha$) which is less than 1, and said selected percentage is at least 60%.

7. A method of identifying interference pulses in an audio signal, said method comprising:
    (a) receiving samples of the audio signal derived at successive sampling instants;
    (b) storing in memory any given sample and at least two other samples which are in a time window around the given sample;

(c) comparing the values of each of the other samples in the time window with a reference level which corresponds to the value of the given sample;

(d) deriving a count (G) of the number of said other samples which exceeds said reference level; and (e) identifying the given sample as an interference pulses when said count (G) signifies a number of samples below a selected percentage of all samples in said time window.

* * * * *